(12) United States Patent
Lu et al.

(10) Patent No.: US 9,502,469 B2
(45) Date of Patent: Nov. 22, 2016

(54) ELECTRICALLY RECONFIGURABLE INTERPOSER WITH BUILT-IN RESISTIVE MEMORY

(71) Applicant: QUALCOMM Incorporated, San Diego, CA (US)

(72) Inventors: Yu Lu, San Diego, CA (US); Vidhya Ramachandran, Cupertino, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/527,267

(22) Filed: Oct. 29, 2014

(65) Prior Publication Data
US 2016/0126291 A1    May 5, 2016

(51) Int. Cl.
| | |
|---|---|
| *H01L 29/49* | (2006.01) |
| *H01L 27/24* | (2006.01) |
| *H01L 45/00* | (2006.01) |
| *H01L 23/538* | (2006.01) |
| *H01L 25/065* | (2006.01) |
| *H01L 23/498* | (2006.01) |

(52) U.S. Cl.
CPC ......... *H01L 27/2463* (2013.01); *H01L 23/538* (2013.01); *H01L 25/0655* (2013.01); *H01L 27/2409* (2013.01); *H01L 27/2436* (2013.01); *H01L 45/16* (2013.01); *H01L 23/49827* (2013.01); *H01L 2224/16227* (2013.01); *H01L 2924/15192* (2013.01); *H01L 2924/15311* (2013.01)

(58) Field of Classification Search
CPC ................. H01L 27/2463; H01L 27/2409
See application file for complete search history.

(56) References Cited

U.S. PATENT DOCUMENTS

| | | | |
|---|---|---|---|
| 8,710,655 B2 | 4/2014 | Kim et al. | |
| 9,111,941 B2 * | 8/2015 | Gong | .................. H01L 23/5386 |
| 2009/0303690 A1 * | 12/2009 | Lee | ...................... H01L 23/3128 361/767 |
| 2010/0059880 A1 * | 3/2010 | Baek | ..................... H01L 23/467 257/713 |
| 2011/0140268 A1 * | 6/2011 | Cheah | ............... H01L 23/49833 257/737 |
| 2012/0126427 A1 * | 5/2012 | Sasaki | ............... H01L 21/76232 257/777 |
| 2012/0187578 A1 * | 7/2012 | Li | ........................... H01L 23/13 257/778 |
| 2012/0262862 A1 * | 10/2012 | Johnson | .................... G06F 1/32 361/679.02 |
| 2012/0273961 A1 * | 11/2012 | Kwon | .................... G11C 5/025 257/774 |
| 2013/0058067 A1 * | 3/2013 | Yee | ......................... H01L 23/36 361/820 |
| 2013/0175686 A1 * | 7/2013 | Meyer | ................. H01L 25/0655 257/738 |
| 2014/0032888 A1 | 1/2014 | O'Mullan et al. | |
| 2014/0089609 A1 | 3/2014 | Kegel et al. | |
| 2014/0191419 A1 | 7/2014 | Mallik et al. | |
| 2014/0203457 A1 | 7/2014 | Kim et al. | |
| 2014/0306349 A1 | 10/2014 | Gu et al. | |
| 2015/0214207 A1 * | 7/2015 | Yoshida | .............. H01L 25/0657 438/109 |

OTHER PUBLICATIONS

International Search Report and Written Opinion—PCT/US2015/048165—ISA/EPO—Nov. 5, 2015.

* cited by examiner

*Primary Examiner* — Michael Shingleton
(74) *Attorney, Agent, or Firm* — Seyfarth Shaw LLP

(57) ABSTRACT

An integrated interposer may include a substrate and a resistive-type non-volatile memory (NVM) array(s). The integrated interposer may also include a contact layer on a first surface of the substrate. The contact layer may include interconnections configured to couple the resistive-type NVM array(s) to a die(s). The resistive-type NVM array(s) may be partially embedded within the contact layer of the integrated interposer.

17 Claims, 10 Drawing Sheets

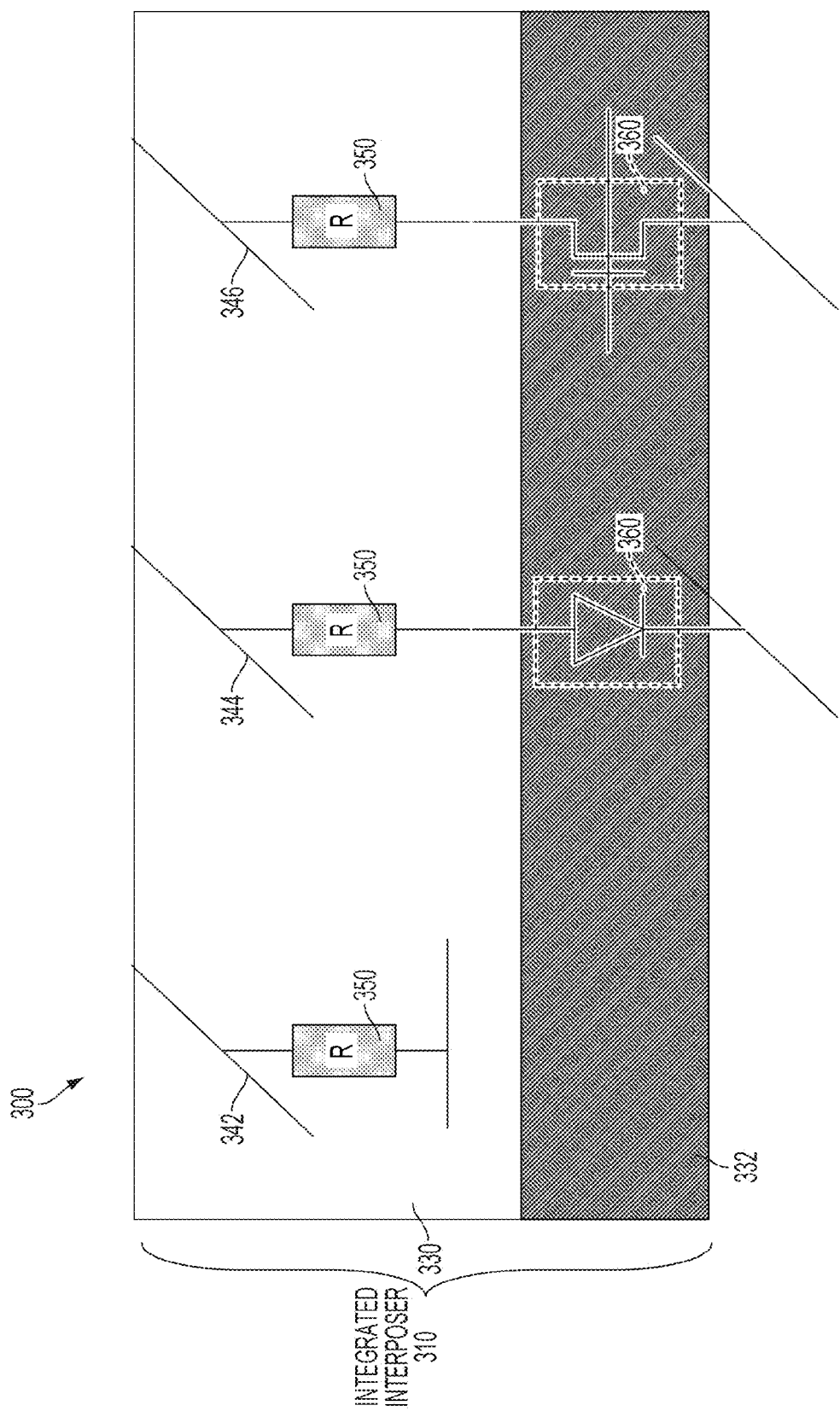

ELECTRICALLY RECONFIGURABLE INTERPOSER WITH BUILT-IN RESISTIVE MEMORY

BACKGROUND

Field

The present disclosure generally relates to integrated circuits (ICs). More specifically, one aspect of the present disclosure relates to an electrically reconfigurable interposer with built-in resistive memory.

Background

The process flow for semiconductor fabrication of integrated circuits (ICs) may include front-end-of-line (FEOL), middle of line (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate contact formation. Middle of line layers may include, but are not limited to, MOL contacts, vias or other layers within close proximity to the semiconductor device transistors or other like active devices. The BEOL processes may include a series of wafer processing steps for interconnecting the semiconductor devices created during the FEOL and MOL processes. Successful fabrication of modern semiconductor chip products involves an interplay between the materials and the processes employed.

An interposer is a die-mounting technology in which the interposer serves as a base upon which the semiconductor dies of a system on chip (SoC) are mounted. An interposer may include wiring layers of conductive traces and conductive vias for routing electrical connections between the semiconductor dies (e.g., memory modules and processors). In most applications, the interposer does not include active devices such as diodes and transistors.

SUMMARY

An integrated interposer may include a substrate and a resistive-type non-volatile memory (NVM) array(s). The integrated interposer may also include a contact layer on a first surface of the substrate. The contact layer may include interconnections configured to couple the resistive-type NVM array(s) to a die(s). The resistive-type NVM array(s) may be partially embedded within the contact layer of the integrated interposer.

A system on chip (SOC) may include an interposer. The system on chip may also include a resistive-type non-volatile memory (NVM) array(s). The resistive-type NVM array(s) may be partially embedded within the interposer. The system on chip may include interconnections configured to couple the resistive-type NVM array(s) to a die(s).

An integrated interposer may include a substrate and a resistive-type non-volatile memory (NVM) array(s). The integrated interposer may also include means for interconnecting the resistive-type NVM array(s) to a die(s). The resistive-type NVM array(s) may be partially embedded within the contact layer of the interconnecting means. The substrate may support the interconnecting means.

A method of fabricating an integrated interposer may including fabricating a resistive-type non-volatile memory (NVM) array(s) within a dielectric layer on a first surface of an interposer substrate. The method may also include plating a conductive material within the dielectric layer. The method may further include etching the conductive material within the dielectric layer to form a contact layer on the first surface of the interposer substrate. The contact layer may include interconnections configured to couple the resistive-type NVM array(s) to a die(s). The resistive-type NVM array(s) may be partially embedded within the contact layer of the integrated interposer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 3A and 3B are block diagrams illustrating resistive memory bit cells according to one aspect of the disclosure.

DETAILED DESCRIPTION

Figure 1:
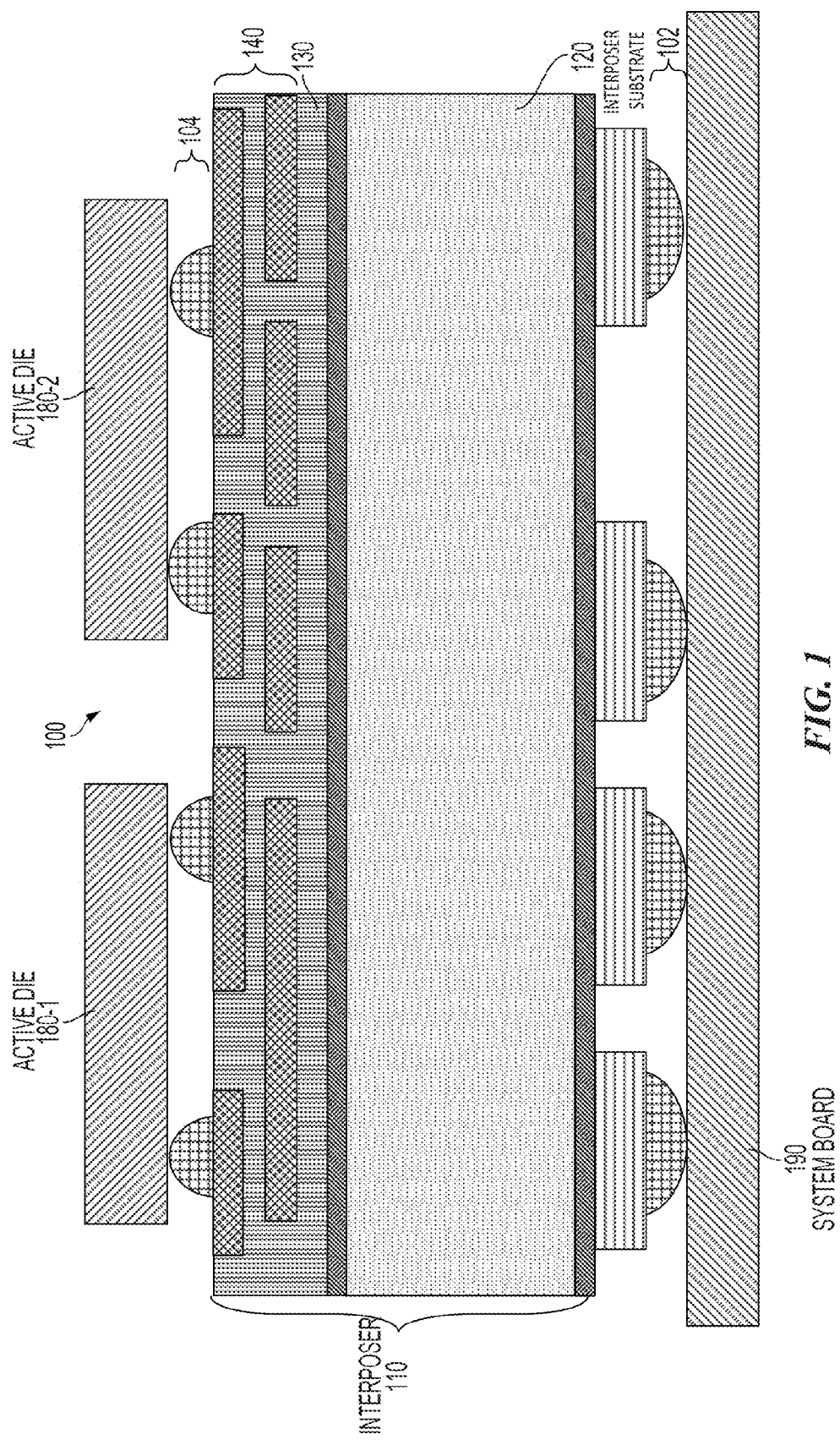
FIG. 1 shows a cross-sectional view illustrating a system on chip including an integrated interposer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Resistive memory technologies, such as magnetic random access memory (MRAM), resistive RAM (RRAM), and phase change memory (PCM), are maturing at a rapid pace. These resistive memory technologies can potentially provide non-volatile memory (NVM) solutions for a wide range of density and performance design points. In particular, many applications specify a small amount of NVM. For example, current techniques for providing NVM include embedded NVM, such as eFLASH or other like resistive memory. Unfortunately, the additional process steps for creating FLASH or a resistive memory macro often is not justified if only a small amount of memory is specified. Another option is a separate FLASH chip or resistive memory. Unfortunately, this solution provides limited bandwidth and consumes additional power due to off-chip input/output (I/O). A further option is battery-backed dynamic RAM (DRAM).

Because resistive memory devices do not involve semiconducting devices, resistive memory devices can be fabricated (e.g., embedded) within the interconnect levels of a device. Accessing these embedded resistive memory devices (read, write, and bit selection), however, involves active semiconductor devices. For example, embedded resistive memories like spin-transfer-torque (STT) MRAM (STT-MRAM), RRAM, or PCM, when integrated within logic interconnect levels, could affect the resistive capacitive (RC) or reliability characteristics of the interconnect level. Some resistive memory technology might also impose process limitations that are incompatible with logic-optimized interconnect fabrication.

Embedded resistive memories like STT-MRAM, RRAM, or PCM, when coupled with an active semiconductor selection transistor to form a one-transistor one-resistor (1T1R) bitcell, involve a stacked-conductive structure to electrically connect the bottom side of the resistive memory device to the transistor. In a typical logic-interconnect process, however, patterning specifications from synchronous RAM (SRAM) and signal routing generally dictate layout rules. As a result, the minimum area of the stacked-metal connection is large, as compared with a typical resistive memory size. This creates a severe bitcell size limitation when implementing embedded resistive memories.

Some described implementations relate to interposer technology. An interposer generally serves as an intermediate layer that can be used for direct electrical interconnection between one component or substrate and a second component or substrate with the interposer positioned in between. For example, an interposer may have a pad configuration on one side that can be aligned with corresponding pads on a first component (e.g., a die), and a different pad configuration on a second side that corresponds to pads on a second component (e.g., a package substrate, system board, etc.) Interposers are widely used for integrating multiple chips on a single package. In addition, interposer substrates can be composed of glass and quartz, organic, or other like material and normally contain a few interconnect layers.

Various aspects of the disclosure provide techniques for embedding resistive memory within an integrated interposer.

The process flow for semiconductor fabrication of an integrated interposer may include front-end-of-line (FEOL) processes, middle of line (MOL) processes, and back-end-of-line (BEOL) processes. It will be understood that the term "layer" includes film and is not to be construed as indicating a vertical or horizontal thickness unless otherwise stated. As described herein, the term "substrate" or "interposer substrate" may refer to a substrate of a diced wafer or may refer to the substrate of a wafer that is not diced. Similarly, the terms wafer and die may be used interchangeably unless such interchanging would tax credulity.

In one aspect of the present disclosure, at least one resistive-type non-volatile memory (NVM) array is embedded within an integrated interposer. In some configurations, a contact layer on a surface of the interposer substrate includes interconnections. These interconnections may be configured to couple the resistive-type NVM array(s) to at least one die. In this arrangement, the resistive-type NVM array(s) is at least partially embedded within the contact layer of the integrated interposer. In another configuration, the resistive-type NVM array(s) is field reconfigurable to selectively couple at least a first die and a second die to a bus within the contact layer of the integrated interposer.

According to one aspect of the disclosure, an integrated interposer with a glass, quartz or organic substrate includes embedded resistive memory. Active selection devices for the resistive memory may be fabricated based on low cost thin film technology (e.g., thin film active devices). These thin film active devices can be organic. The resistive memory may be field reconfigurable to selectively couple at least a first die and a second die to a bus within a contact layer of the integrated interposer. This configuration enables the combination of an active die for targeted (e.g., high performance) technologies for each system functionality (processor, modem, memory, etc.), while the integrated interposer provides other functionality (e.g., reconfigurable die interconnection, embedded resistive memory, embedded active selection devices) and interconnection to a system board.

FIG. 1 show a cross-sectional view illustrating a system on chip (SoC) 100 having an integrated interposer 110 including an interposer substrate 120 and a contact layer 130 on a surface of the interposer substrate 120. The interposer substrate 120 may be a semiconductor substrate (e.g., a silicon wafer) or an organic substrate (e.g., glass, quartz, sapphire, or other like organic material). The contact layer 130 is disposed on the interposer substrate 120 including interconnections 140. In addition, active die 180 (180-1, 180-2) are coupled to the contact layer 130 of the integrated interposer 110 through a second set of interconnects 104.

A first set of interconnects 102 may couple a system board 190 to the integrated interposer 110 through, for example, a redistribution layer (not shown). Although shown with reference to the system board 190, it should be recognized that the first set of interconnects 102 may be coupled to a printed circuit board (PCB), a package substrate or other like carrier substrate to the integrated interposer 110. In some configurations, one or more devices may be attached to each side of the integrated interposer 110.

Figure 2:
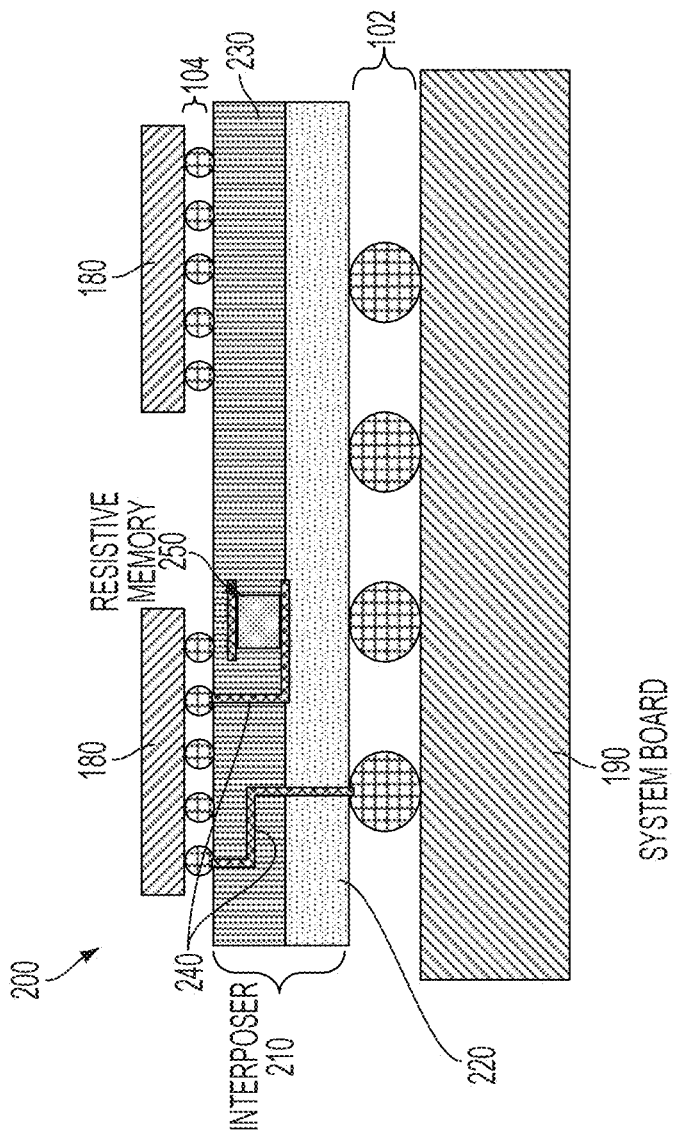
FIG. 2 is a block diagram illustrating a system on chip including an integrated interposer having an embedded resistive memory according to one aspect of the disclosure.

FIG. 2 shows a cross-sectional view illustrating a system on chip (SoC) 200 including a resistive memory 250 at least partially embedded within an integrated interposer 210 according to one aspect of the present disclosure. In this configuration, the resistive memory 250 is disposed on a surface of the interposer substrate 220 and embedded within a contact layer 230 on the surface of the interposer substrate 220. Representatively, the contact layer 230 includes interconnections 240 (e.g., electrical traces) coupling the resistive memory 250 to the active die 180.

In this configuration, the resistive memory 250 stores device configuration data (e.g., redundancy data, configuration settings, boot code, etc.) The resistive memory 250 may be configured as an embedded resistive memory including, but not limited to, spin-transfer-torque (STT) MRAM (STT-MRAM), RRAM, or PCM, integrated within the logic interconnect levels (e.g., interconnections 240) of the contact layer 230 without negatively affecting the resistive capacitive (RC) or reliability characteristics of the contact layer 230. In one aspect of the disclosure, the resistive memory 250 is arranged to provide off-chip cache memory (e.g., level four (L4) cache memory) for the active die 180.

In one aspect of the present disclosure, the resistive memory 250 is fabricated between two interconnect levels of the integrated interposer 210, without active selection devices being created on the integrated interposer 210. In another aspect of the present disclosure, the resistive memory 250 is fabricated along with the active selection devices within the integrated interposer 210. In this arrangement, the active selection devices may be implemented using thin film devices (e.g., thin film diodes, thin film transistors, etc.) built on one of the interconnect levels within the integrated interposer 210. In a further aspect of the present disclosure, the resistive memory 250 is fabricated along with the active selection devices on a semiconductor (e.g., silicon) interposer in which the active selection devices within the integrated interposer are fabricated on a semiconductor interposer substrate.

In these arrangements, peripheral circuits, including decoders, sense-amps, and some control logic, is fabricated using the same thin-film-transistor devices or bulk devices on a silicon interposer substrate. Alternatively, at least a portion of the control logic is built on the active die (e.g., 180) instead of on the integrated interposer 210. The noted thin film diode or thin film transistor selection devices could be stacked to increase an efficiency of a resistive memory array. For example, the decoder circuit and the sense-amp circuit could be fabricated on a first layer of thin film transistors or a silicon interposer substrate, while the resistive memory array with thin film diode or thin film selection devices is fabricated in the same physical area, as described in further detail below.

Figure 3B:
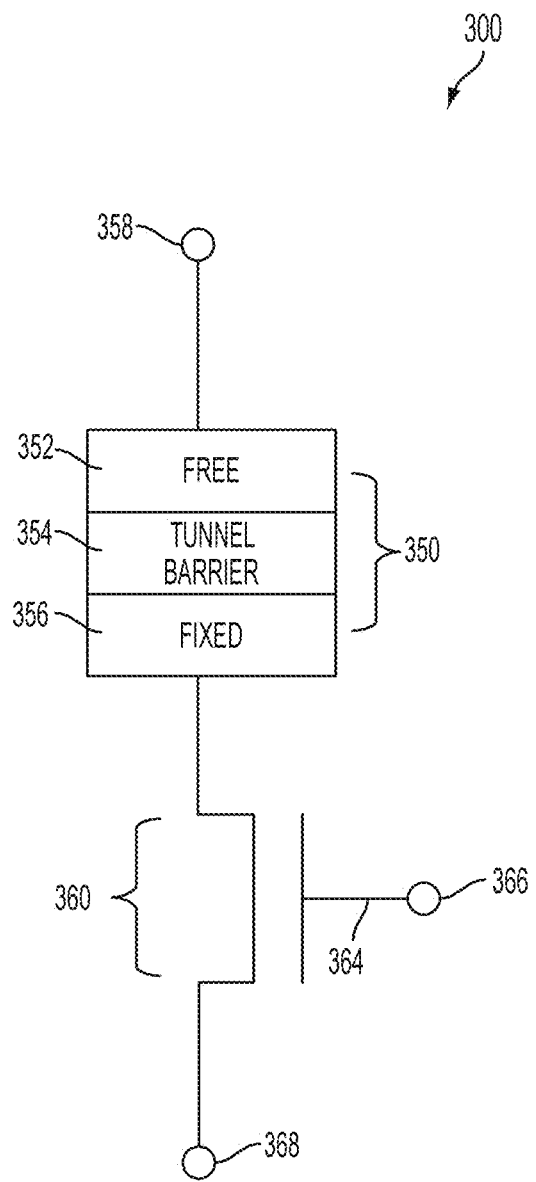

FIGS. 3A and 3B are block diagrams illustrating resistive memory cells according to one aspect of the disclosure. FIG. 3A further illustrates the resistive memory 250 of FIG. 2. In this arrangement, each resistive memory 350 is coupled to an interconnect (e.g., 342, 344, 346) within a contact layer 330 of an integrated interposer 310. The resistive memory cells 300 (e.g., bit cells) also include active selection devices 360 within an active layer 332 (e.g., an oxide layer, a dielectric layer, etc.) of the contact layer 330. Alternatively, the active layer 332 may be a silicon substrate or other like layer to enable fabrication of the active selection devices 360. The active selection devices 360 may be implemented using thin film devices (e.g., thin film diodes, thin film transistors, etc.) built on one of the interconnect levels (e.g., contact layer 330) within the integrated interposer 310.

FIG. 3B further illustrates one of the resistive memory cells 300 of FIG. 3A for a memory device including the resistive memory 350 (e.g., magnetic tunnel junction (MTJ)) coupled to one of the active selection devices 360 (e.g., an access transistor). The memory device may be a magnetic random access memory (MRAM) device that is built from an array of individually addressable MTJs. An MTJ stack may include a free layer, a fixed layer and a tunnel barrier layer there between as well as one or more ferromagnetic layers. Representatively, a free layer 352 of the resistive memory 350 is coupled to a bit line 358. One of the active selection devices 360 is coupled between a fixed layer 356 of the resistive memory 350 and a fixed potential node 368. A tunnel barrier layer 354 is coupled between the fixed layer 356 and the free layer 352. The active selection devices 360 include a gate 364 coupled to a word line 366.

Synthetic anti-ferromagnetic materials may form the fixed layer 356 and the free layer 352. For example, the fixed layer 356 may comprise multiple material layers including a cobalt-iron-boron (CoFeB) layer, a ruthenium (Ru) layer and a cobalt-iron (CoFe) layer. In addition, the free layer 352 may also include multiple material layers including a cobalt-iron-boron (CoFeB) layer, a ruthenium (Ru) layer and a cobalt-iron (CoFe) layer. Further, the tunnel barrier layer 354 may be magnesium oxide (MgO).

The resistive memory cell of FIG. 3B may be implemented using an STT-MRAM bit cell. The STT-MRAM bit cell may include a magnetic tunnel junction (MTJ) storage element. The MTJ storage element is formed, for example, from at least two anti-ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read one of the resistive memory cells 300.

Figure 4:
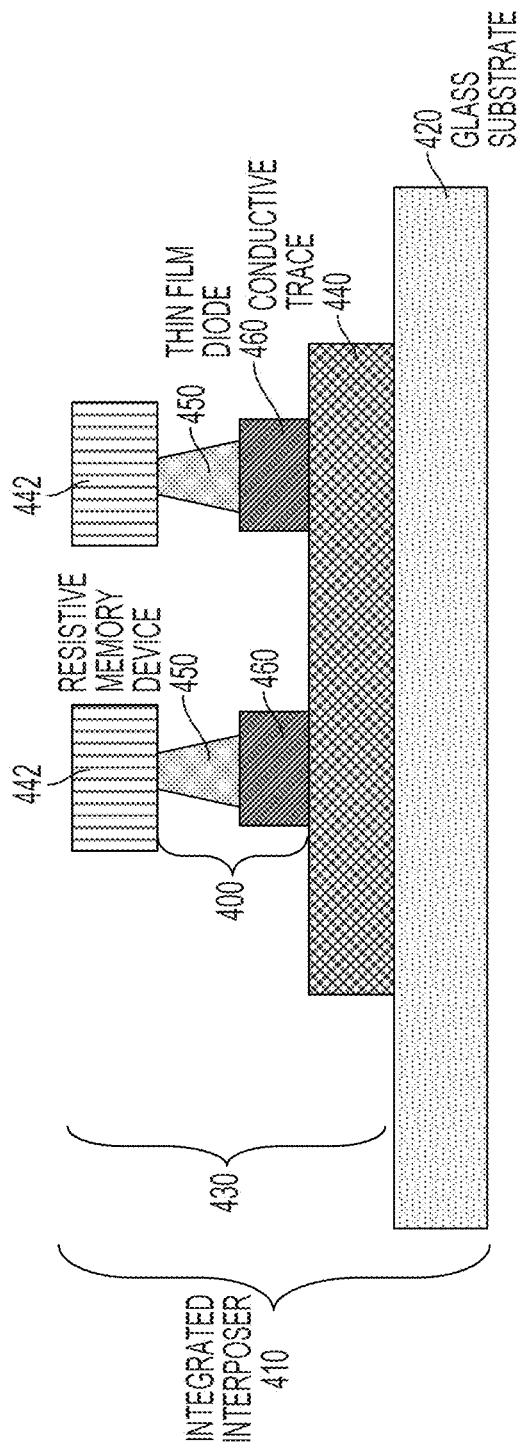
FIG. 4 is a block diagram illustrating an integrated interposer including embedded resistive memory cells according to one aspect of the disclosure.

FIG. 4 is a block diagram illustrating an integrated interposer 410 including embedded resistive memory cells 400 composed of a resistive memory device 450 and a thin film diode as an active selection device 460, according to one aspect of the disclosure. In this arrangement, the embedded resistive memory cells 400 are fabricated between a first interconnect level 440 (e.g., a conductive (Cu) trace) and a second interconnect level 442 of a contact layer 430 supported by an interposer substrate 420 (e.g., a glass substrate). In this arrangement, a thin film is deposited on the first interconnect level 440 to form a thin film diode as an active selection device 460. The thin film may be a low-temperature polycrystalline silicon (LTPS) material, an indium gallium zinc oxide (IGZO) material, or other like thin film material.

Figure 5:
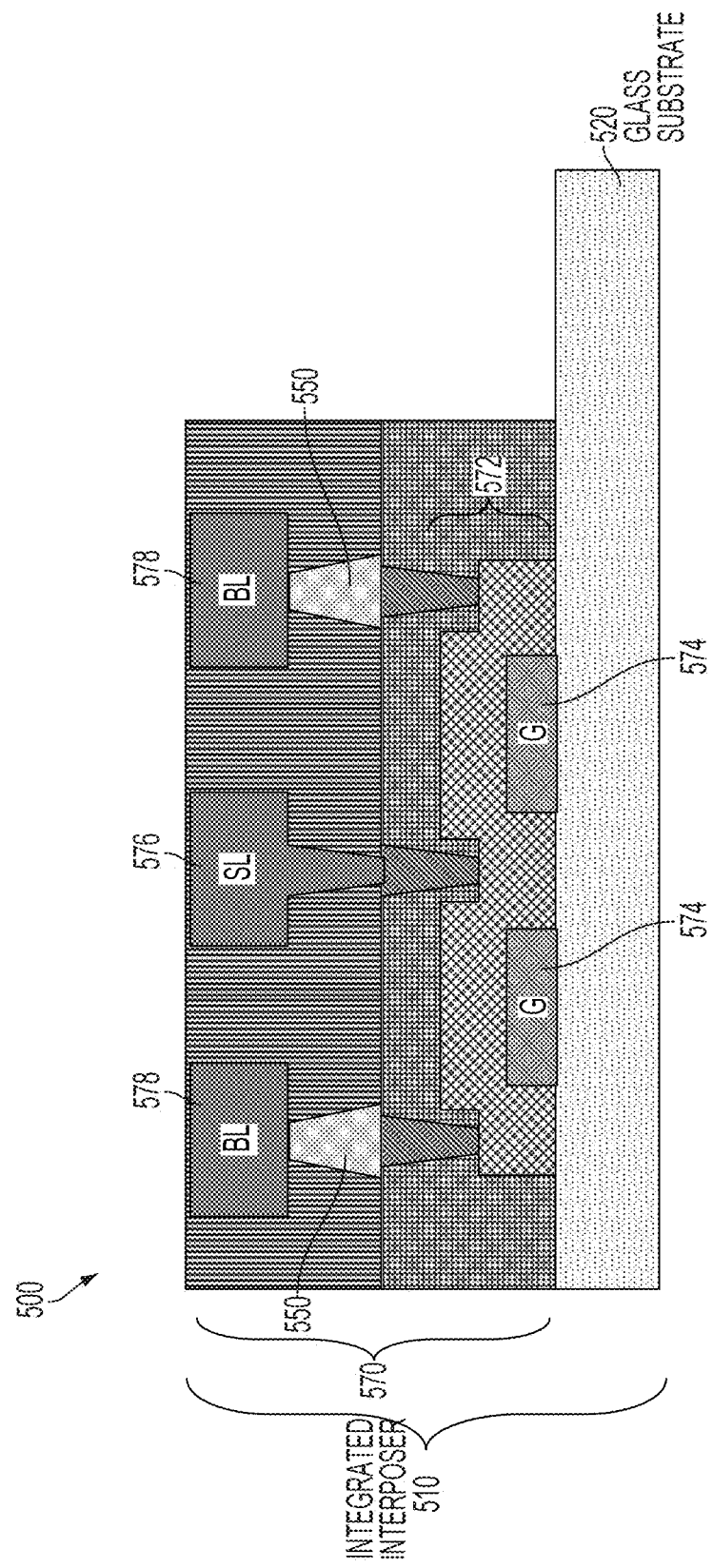
FIG. 5 shows a cross-sectional view of an integrated interposer including peripheral circuitry fabricated within a contact layer of the integrated interposer according to one aspect of the disclosure.

FIG. 5 shows a cross-sectional view 500 of an integrated interposer 510 including peripheral circuitry 570 fabricated within, for example, a contact layer of the integrated interposer 510 according to one aspect of the disclosure. The peripheral circuitry 570 may include thin film transistors 574 having a gate on a surface of an interposer substrate 520 (e.g., a glass substrate). The gate may be fabricated first and the channel material deposited later. In this arrangement, a thin film 572 (e.g., low-temperature polycrystalline silicon) is deposited on the surface of the interposer substrate 520 and on the thin film transistors 574. The peripheral circuitry 570 also includes a source line (SL) 576 and bit lines 578 for accessing the resistive memory 550.

In this aspect of the present disclosure, thin film active devices are embedded within an integrated interposer 510 to enable formation of the peripheral circuitry 570. These thin film active devices can be organic. A further arrangement of these thin film active devices for forming the peripheral circuitry 570 to control access to/from the resistive memory 550 is shown, for example, in FIG. 6.

Figure 6:
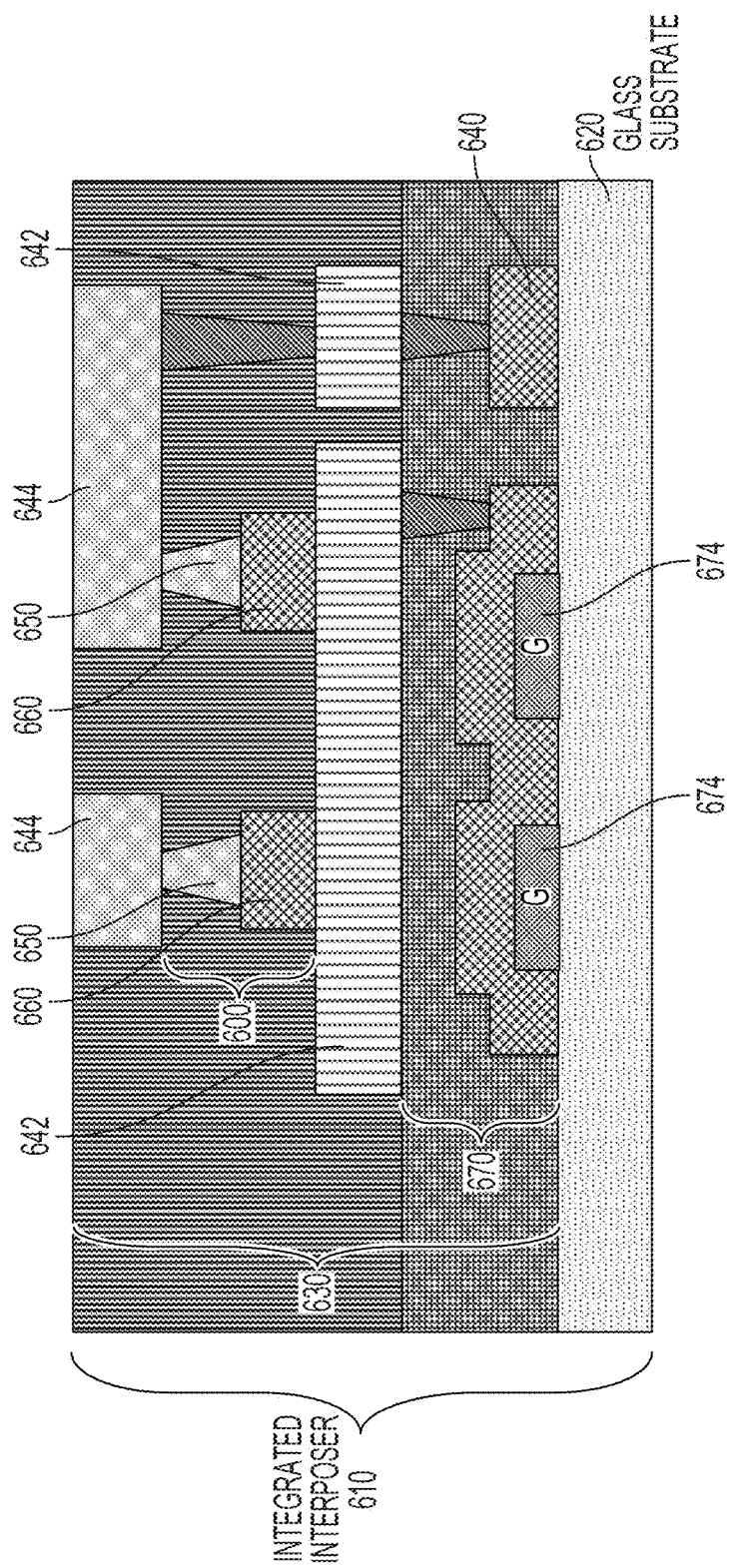
FIG. 6 is a block diagram illustrating an integrated interposer including peripheral circuitry and the resistive memory cells within interconnect levels of a contact layer, according to one aspect of the disclosure.

FIG. 6 is a block diagram illustrating an integrated interposer 610 in which the peripheral circuitry 670 and the resistive memory cells 600 (650, 660) are arranged within the interconnect levels of a contact layer 630, according to one aspect of the disclosure. In this arrangement, the peripheral circuitry 670 is fabricated between a first interconnect level 640 (e.g., a conductive (Cu) trace) and a second interconnect level 642 of a contact layer 630 supported by an interposer substrate 620 (e.g., a glass substrate). In addition, the resistive memory cells 600 are fabricated between the second interconnect level 642 and a third interconnect level 644 of the contact layer 630. In this arrangement, a thin film is deposited on the second interconnect level 642 to form a thin film diode as an active selection device 660.

In this arrangement, a decoder circuit and a sense-amp circuit of the peripheral circuitry 670 are fabricated on a first layer of thin film transistors 674, while the resistive memory 650 with thin film diode or thin film selection devices (e.g., 660) is fabricated in the same physical area. Alternatively, the peripheral circuitry 670 may be fabricated on a silicon interposer substrate or on the active die. In one configuration, the peripheral circuitry 670 may be fabricated with a cross-bar architecture to control access to/from the resistive memory 650.

The various interposers described above allow integration of heterogeneous chips (logic, memory, etc.) into a single package. The interposers may be configured as low-cost, passive interposers. Unfortunately, the interconnections between chips or between any functional devices (passive, memory protection unit (MPU), memory, analog, etc.) on the interposer are fixed. In an example case where an MPU and a DRAM are placed on an interposer, a bump pattern from the different DRAM vendors should match each other for the same interposer to be used. In another scenario, where a high-speed data bus on the interposer transfers data between dies, it is desirable to be able to trim the impedance of the lines to optimize data rate.

Figure 7:
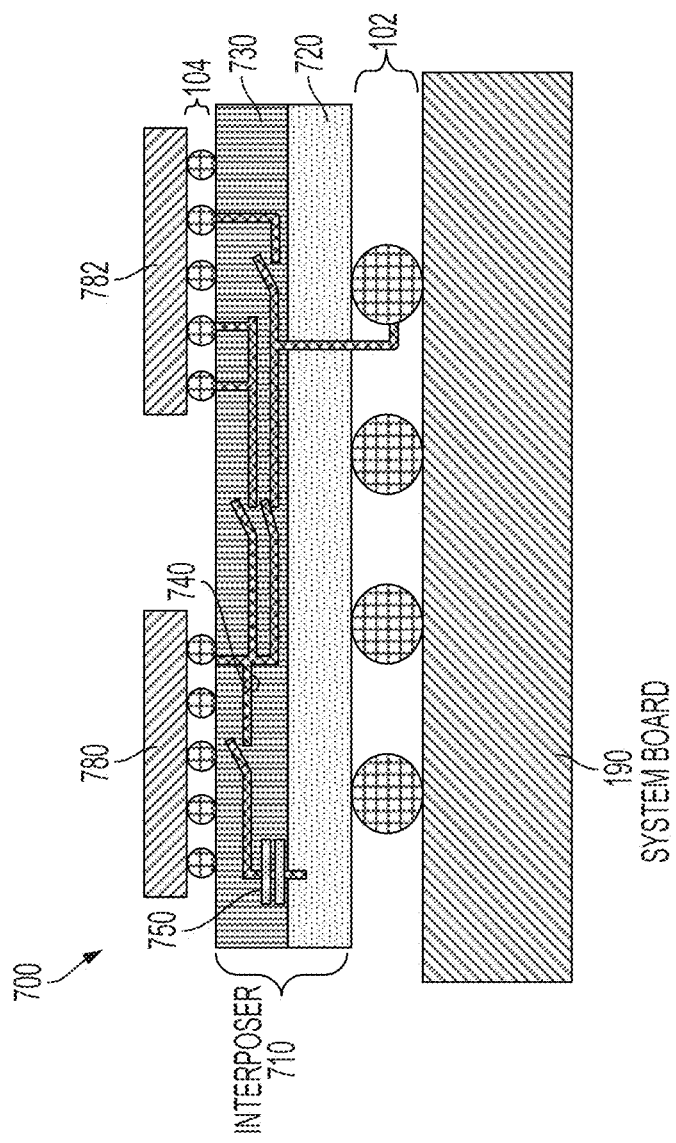
FIG. 7 shows a cross-sectional view illustrating a system on chip (SoC) including a re-configurable interposer having an embedded memory according to one aspect of the present disclosure.

FIG. 7 shows a cross-sectional view illustrating a system on chip (SoC) 700 including a re-configurable interposer 710 having an embedded memory 750 according to one aspect of the present disclosure. The embedded memory 750 may be configured as multi-time programmable (MTP) memory, including pseudo-MTP. Alternatively, the embedded memory 750 may be configured to provide a small amount of NVM (e.g., RRAM, MRAM, PCM, etc.) In this configuration, the embedded memory 750 enables field reconfiguration of a high-speed die-to-die bus 740 within a contact layer 730 of the re-configurable interposer 710. Field reconfiguration of a high-speed die-to-die bus 740 may include selectively coupling a first die 780 and a second die 782 to the high-speed die-to-die bus 740.

Re-configuration of the re-configurable interposer 710 enables an active die for targeted (e.g., high performance) technologies for each system functionality (processor, modem, memory, etc.). Furthermore, the re-configurable interposer 710 provides other functionality (e.g., reconfigurable die interconnection, embedded resistive memory, embedded active selection devices) and interconnection to the system board 190. The re-configurable interposer 710 enables re-routing of the high-speed die-to-die bus 740. In addition, re-configuration of the re-configurable interposer 710 enable tuning of the high-speed die-to-die bus 740 for improved transmission as well as improved access to internal nodes during testing.

As noted, the embedded memory 750 may be pseudo-MTP when implemented as an e-fuse or anti-fuse. Alternatively, the embedded memory 750 may be configured as resistive memory that is built on an interposer substrate 720 (e.g., silicon or glass) using thin-film devices. Whether configured as either MTP or NVM, the embedded memory 750 enables configuration of the interconnects within the contact layer 730 to accommodate dies with a heterogeneous bump out. The interconnects within the contact layer 730 can be fine-tuned to match the input/output (I/O) of the dies post packaging. Furthermore, field reconfiguration of the re-configurable interposer 710 allows switching of package contacts during testing.

In the configuration described above, a glass interposer substrate can be thinned by etching the glass to a desired thickness. The desired thickness of the glass may vary according to the targeted thickness for fabrication of, for example, thin film transistors (TFTs) (e.g., five-hundred (500) micron thickness). The interposer application, however, may target a fifty (50) to two-hundred fifty (250) microns thickness. In this arrangement, the glass interposer substrate is thinned, for example, through wet etching with etchants (e.g., hydrofluoric acid (HF)). Etch protect layers shield the devices during the glass thinning and any cleaning processes of any via formation.

Figure 8:
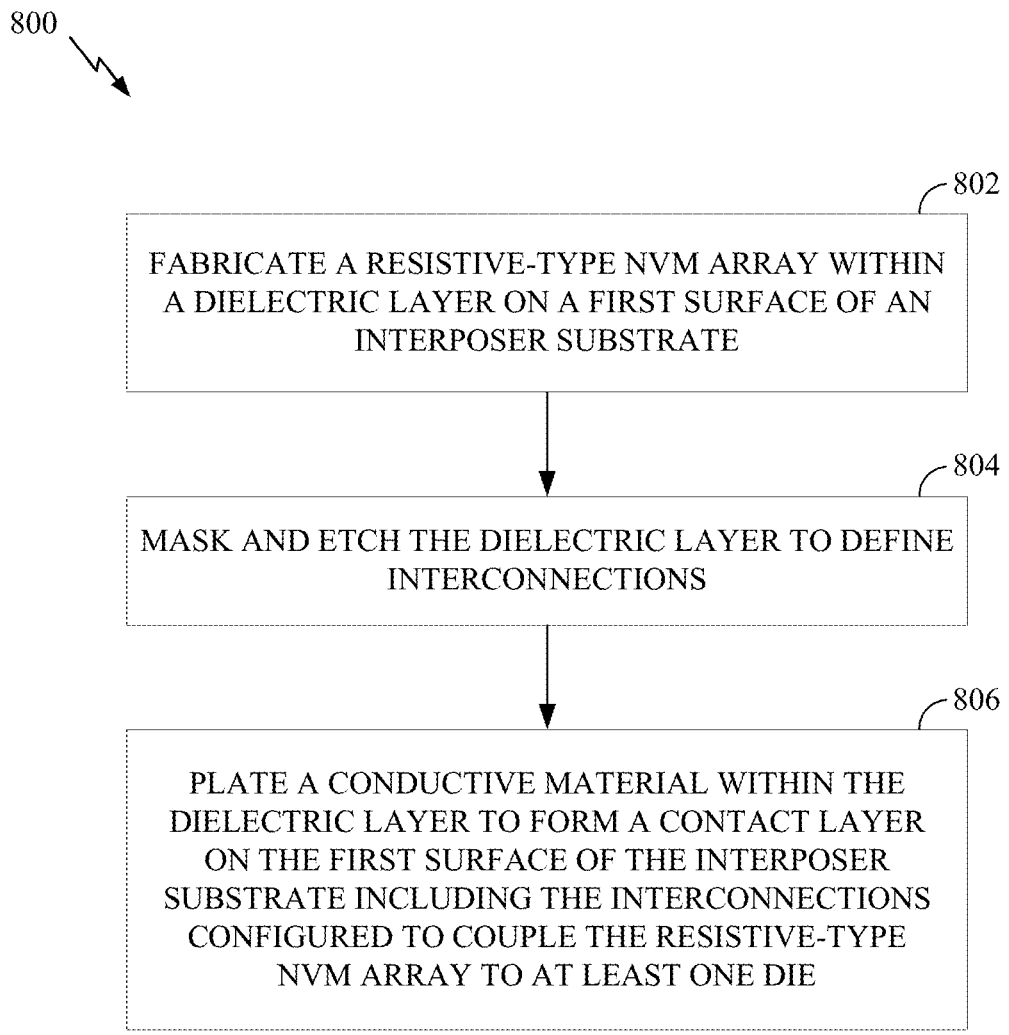
FIG. 8 is a flow diagram illustrating a method for fabricating the integrated interposer having an embedded resistive memory according to one aspect of the disclosure.

FIG. 8 is a flow diagram illustrating a method 800 for fabricating an integrated interposer according to one aspect of the disclosure. At block 802, at least one resistive-type non-volatile memory (NVM) array is fabricated within a dielectric layer on a first surface of an interposer substrate, for example, as shown in FIGS. 3A and 3B. Although the present description has mentioned silicon and glass interposer substrates, other substrate materials including sapphire or other like materials are also contemplated.

At block 804, the dielectric layer is masked and etched to define interconnections within the dielectric layer. At block 806 a conductive material is plated within the dielectric layer. The patterned conductive material within the dielectric layer forms a contact layer on the first surface of the substrate. For example, as shown in FIG. 2, a contact layer 230 includes interconnections 240 configured to couple the resistive memory 250 to an active die 180. In this configuration, the resistive memory is at least partially embedded within the contact layer 230 of the integrated interposer 210.

In one configuration, an integrated interposer includes at least one resistive-type non-volatile memory (NVM) array on a first surface of an interposer substrate. The integrated interposer also includes means for interconnecting the at least one resistive-type NVM array to at least one die. The at least one resistive-type NVM array may be partially embedded within the interconnecting means. In one aspect of the disclosure, the interconnecting means is the contact layer 230/330/430/630/730 of FIGS. 1, 2, 3A, 6 and/or 7, configured to perform the functions recited by the interconnecting means. In another aspect, the aforementioned means may be a device or any layer configured to perform the functions recited by the aforementioned means.

Figure 9:
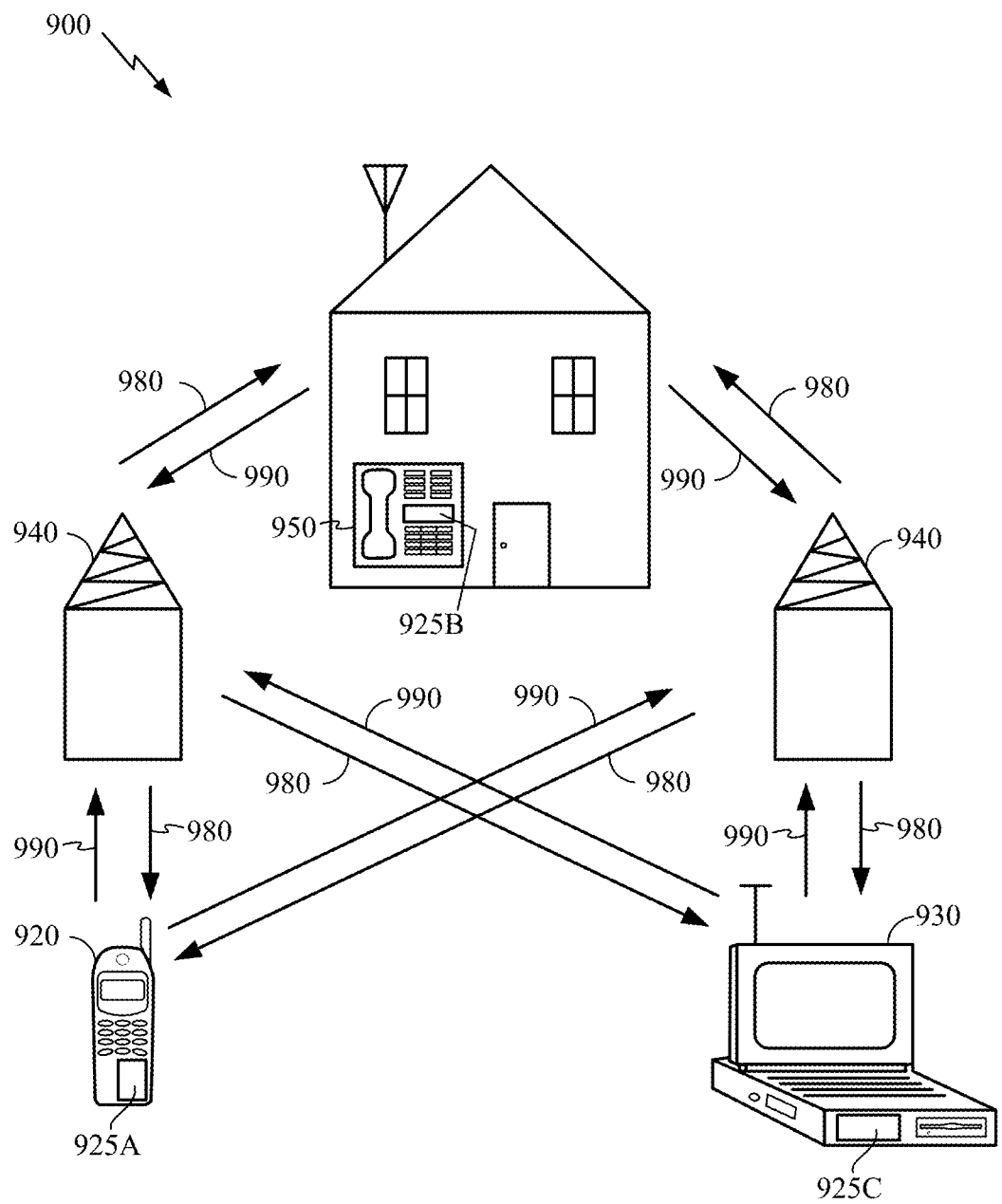
FIG. 9 is a block diagram showing a wireless communication system in which a configuration of the disclosure may be advantageously employed.

FIG. 9 is a block diagram showing an exemplary wireless communication system 900 in which a configuration of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925B, and 925C, which include the disclosed integrated interposer. It will be recognized that any device containing an IC may also include the disclosed integrated interposer, including the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 9 illustrates IC devices 925A, 925B, and 925C, which include the disclosed integrated interposer, the disclosure is not limited to these exemplary illustrated units. Aspects of the present disclosure may be suitably employed in any device, which includes an interposer.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated interposer, comprising:
a substrate;
at least one resistive-type non-volatile memory (NVM) array;
a contact layer on a first surface of the substrate including interconnections configured to couple the at least one resistive-type NVM array to at least one die, the at least one resistive-type NVM array being at least partially embedded within the contact layer of the integrated interposer; and
peripheral circuitry embedded within the integrated interposer and configured to control access to/from the at least one resistive-type NVM array.

2. An integrated interposer, comprising:
a semiconductor substrate,
at least one resistive-type non-volatile memory (NVM) array;
a contact layer on a first surface of the substrate including interconnections configured to couple the at least one resistive-type NVM array to at least one die, the at least one resistive-type NVM array being at least partially embedded within the contact layer of the integrated interposer; and
peripheral circuitry within the semiconductor substrate, the peripheral circuitry configured to control access to/from the at least one resistive-type NVM array.

3. The integrated interposer of claim 1, in which the substrate comprises a glass substrate and the peripheral circuitry comprises thin film transistors (TFTs) and/or thin film diodes on the first surface of the glass substrate.

4. The integrated interposer of claim 1, in which the substrate comprises a glass substrate and the peripheral circuitry comprises multi-layer thin film devices supported by the glass substrate.

5. The integrated interposer of claim 1, in which the at least one resistive-type NVM array is configured to control the interconnections within the contact layer of the integrated interposer.

6. The integrated interposer of claim 1, in which the at least one resistive-type NVM array is field reconfigurable to selectively couple at least a first die and a second die to a bus within the contact layer of the integrated interposer.

7. The integrated interposer of claim 1, in which the at least one resistive-type NVM array comprises resistive memory.

8. The integrated interposer of claim 1, in which the at least one resistive-type NVM array stores device configuration data.

9. The integrated interposer of claim 1 integrated into a mobile phone, a set top box, a music player, a video player, an entertainment unit, a navigation device, a computer, a hand-held personal communication systems (PCS) unit, a portable data unit, and/or a fixed location data unit.

10. A system on chip (SOC), comprising:
an interposer;
at least one resistive-type non-volatile memory (NVM) array at least partially embedded within the interposer; and
interconnections within the interposer coupling the at least one resistive-type NVM array to at least one die, in which the at least one resistive-type NVM array is field reconfigurable to selectively couple at least a first die and a second die to a die-to-die bus within the interposer.

11. The SOC of claim 10, further comprising a contact layer on a surface of an interposer substrate, in which the at least one resistive-type NVM array is embedded within the contact layer and configurable to control the interconnections within the contact layer.

12. The SOC of claim 10, in which the at least one resistive-type NVM array comprises resistive memory.

13. The SOC of claim 10, in which the at least one resistive-type NVM array stores device configuration data.

14. The SOC of claim 10, further comprising peripheral circuitry configured to control access to/from the at least one resistive-type NVM array.

15. The SOC of claim 10 integrated into a mobile phone, a set top box, a music player, a video player, an entertainment unit, a navigation device, a computer, a hand-held personal communication systems (PCS) unit, a portable data unit, and/or a fixed location data unit.

16. An integrated interposer, comprising:
 a substrate;
 at least one resistive-type non-volatile memory (NVM) array;
 means for interconnecting the at least one resistive-type NVM array to at least one die, the at least one resistive-type NVM array being at least partially embedded within the interconnecting means, the substrate supporting the interconnecting means, in which the at least one resistive-type NVM array is field reconfigurable to selectively couple at least a first die and a second die to a die-to-die bus within the interposer.

17. The integrated interposer of claim 16, integrated into a mobile phone, a set top box, a music player, a video player, an entertainment unit, a navigation device, a computer, a hand-held personal communication systems (PCS) unit, a portable data unit, and/or a fixed location data unit.

* * * * *